United States Patent [19]
Koh et al.

[11] Patent Number: 5,856,235
[45] Date of Patent: *Jan. 5, 1999

[54] PROCESS OF VACUUM ANNEALING A THIN FILM METALLIZATION ON HIGH PURITY ALUMINA

[75] Inventors: Wei NMI Koh, Irvine; Wesley J. Louie, Redondo Beach, both of Calif.

[73] Assignee: Northrop Grumman Corporation, Los Angeles, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 421,809

[22] Filed: Apr. 12, 1995

[51] Int. Cl.$^6$ .................. H01L 21/283; H01L 21/324
[52] U.S. Cl. .................. 438/648; 438/648; 438/650; 438/656; 438/660
[58] Field of Search ................... 437/208, 915; 438/648, 650, 656, 660; 257/763

[56] References Cited

U.S. PATENT DOCUMENTS

| | | | |
|---|---|---|---|
| 3,400,210 | 9/1968 | Reimer | 174/69.5 |
| 3,436,604 | 4/1969 | Hyltin et al. | 317/101 |
| 3,577,631 | 5/1971 | Bylander et al. | 29/572 |
| 3,829,356 | 8/1974 | Rutt | 161/161 |
| 4,052,738 | 10/1977 | Hosomi et al. | 358/128 |
| 4,304,624 | 12/1981 | Carson et al. | 156/630 |
| 4,319,264 | 3/1982 | Gangulee et al. | 357/71 |
| 4,320,438 | 3/1982 | Ibrahim et al. | 361/401 |
| 4,352,715 | 10/1982 | Carson et al. | 156/634 |
| 4,354,107 | 10/1982 | Carson et al. | 250/239 |
| 4,361,717 | 11/1982 | Gilmore et al. | 136/246 |
| 4,371,744 | 2/1983 | Badet et al. | 174/68.5 |
| 4,403,238 | 9/1983 | Clark | 357/30 |
| 4,423,468 | 12/1983 | Gatto et al. | 361/404 |
| 4,525,921 | 7/1985 | Carson et al. | 29/577 C |
| 4,551,629 | 11/1985 | Carson et al. | 250/578 |
| 4,569,722 | 2/1986 | Maury et al. | 156/657 |
| 4,581,279 | 4/1986 | Sugishita et al. | 428/209 |
| 4,659,931 | 4/1987 | Schmitz et al. | 250/338 |
| 4,663,191 | 5/1987 | Choi et al. | 427/93 |
| 4,670,770 | 6/1987 | Tai | 357/60 |
| 4,672,152 | 6/1987 | Shinohara et al. | 174/68.5 |
| 4,712,161 | 12/1987 | Pryor et al. | 361/411 |
| 4,739,443 | 4/1988 | Singhdeo | 361/382 |
| 4,749,660 | 6/1988 | Short et al. | 437/24 |
| 4,794,092 | 12/1988 | Solomon | 437/51 |
| 4,797,715 | 1/1989 | Thillays et al. | 357/17 |
| 4,814,945 | 3/1989 | Leibowitz | 361/414 |
| 4,851,615 | 7/1989 | Butt | 174/68.5 |
| 4,931,906 | 6/1990 | Reifel et al. | 361/386 |
| 4,952,446 | 8/1990 | Lee et al. | 428/220 |
| 4,991,283 | 2/1991 | Johnson et al. | 29/595 |
| 5,006,421 | 4/1991 | Yang et al. | 428/641 |
| 5,028,274 | 7/1991 | Basol et al. | 136/264 |
| 5,128,749 | 7/1992 | Hornback et al. | 357/80 |
| 5,132,248 | 7/1992 | Drummond et al. | 437/173 |
| 5,135,556 | 8/1992 | Hornback et al. | 65/43 |
| 5,190,792 | 3/1993 | Blum et al. | 427/560 |
| 5,240,877 | 8/1993 | Yoshida et al. | 437/184 |
| 5,290,588 | 3/1994 | Romero et al. | 427/123 |
| 5,300,307 | 4/1994 | Frear et al. | 427/96 |
| 5,342,793 | 8/1994 | Santangelo et al. | 437/25 |
| 5,471,084 | 11/1995 | Suzuki et al. | 257/421 |

FOREIGN PATENT DOCUMENTS 3-216485  1/1993  Japan .

OTHER PUBLICATIONS

Microelectronics Packaging Handbook, New York, Van Nostrand Reinhold. p. 1144, 1988.
"Asahi Chemical to Mass produce sintered alumina substrates."; Japan Chemical Week, vol. 27 (issue 1359) p. 15. Author not available, Apr. 1986.

*Primary Examiner*—David Graybill
*Attorney, Agent, or Firm*—Terry J. Anderson; Karl J. Hoch, Jr.

[57] ABSTRACT

A thin-film microcircuit comprising fabricating a substrate of high-purity, densely packed alumina ceramic with a fine grain size, and metallization deposited thereon and applying a vacuum anneal to the metallization.

4 Claims, 3 Drawing Sheets

Fig. 1a
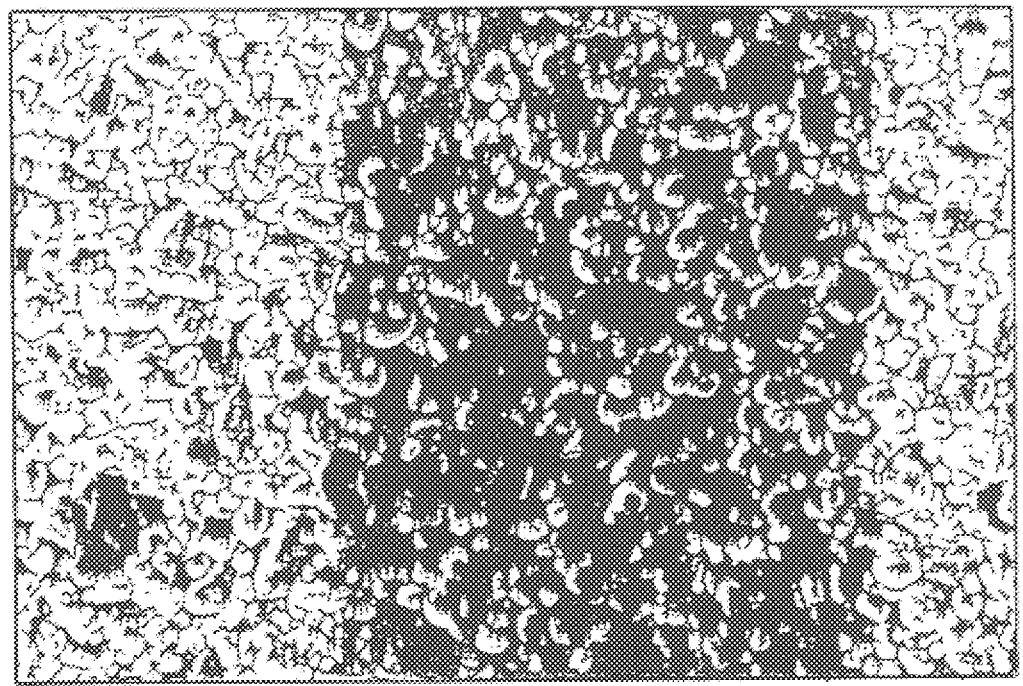
Fig. 1b
(PRIOR ART)

PROCESS OF VACUUM ANNEALING A THIN FILM METALLIZATION ON HIGH PURITY ALUMINA

FIELD OF THE INVENTION

The present invention relates generally to high density multi-layer integrated circuit modules for integrating infrared detector arrays to signal conditioning electronics, and more particularly to thin-film microcircuits with fine lines and pitches of 30 microns or less.

BACKGROUND OF THE INVENTION

Space-based surveillance systems use infrared detectors coupled to computerized data processors for monitoring heated objects and their movements in the atmosphere below and on the ground. The infrared spectrum covers a wide range of wavelengths, from about 0.75 micrometers to 1 millimeter. The function of infrared detectors is to respond to energy of a wavelength within some particular portion of the infrared region. Heated objects dissipate thermal energy having characteristic wavelengths within the infrared spectrum. Different levels of thermal energy, corresponding to different sources of heat, are characterized by the emission of signals within different portions of the infrared frequency spectrum. Detectors are selected in accordance with their sensitivity in the range of interest to the designer. Similarly, electronic circuitry that receives and processes the signals from the infrared detectors is also selected in view of the intended detection function.

Current infrared detection systems incorporate arrays of large number of discrete, highly sensitive detector elements, the outputs of which are connected to sophisticated processing circuitry. By rapidly analyzing the pattern and sequence of detector element excitation, the processing circuitry can identify and monitor sources of infrared radiation. It is difficult, however, to actually construct structures that are made of a million or more detector elements and associated circuitry. Practical applications for contemporary infrared detection systems have necessitated that further advances be made in miniaturization of the detector array and accompanying circuitry, and improvements in reliability and economical production.

In the prior art, a number of detector array modules have been proposed for coupling an array of closely spaced detectors to processing circuitry. Such modules are typically formed such that all connection to and from the module are disposed on a first horizontal layer, with electronic devices and connecting circuitry disposed within the module on one of several stacked horizontal layers interconnected by vertical conductors, known as vias, extending through the layers. A principal shortcoming of this construction is that a single layer is unduly congested with connections to all detectors and external electronics and must also support a large number of vias extending to the parallel layers. The number of detector elements that may be connected as well as the number of connectors to external electronics that support on-focal plane processors are thereby limited by the size of the connecting layer and the minimum width and spacing of the conductors.

Other modules proposed in the prior art address the congestion and space optimization by orienting the detector array perpendicular to the plane of the module layers, adjacent to one edge of the module. Such constructions are commonly referred to as "Z-technology architectures". Z-technology modules are typically formed by stacking multiple layers of thin-film substrates and bump bonding an end of each layer to an adjacent row of the detector array. Conductors extending along the surface of the substrates have end portions that are carefully aligned to contact leads from the individual detector elements. Such constructions advantageously avoid wiring congestion associated with connecting all detectors to a single module layer and reduce the accompanying need for vertical vias that detract from the useable space with the module. The detector arrays have pixels which are typically less than a 100 microns apart and are integrated to the modules by flip-chip bump bonding.

To maintain an interconnect directly behind each pixel in the Z direction the module layers must be kept very thin, usually less than one pixel center-to-center spacing. The layers, which are ceramic substrates having thin-film microcircuits printed thereupon, are laminated using extremely thin thermal setting adhesive sheets. A principal shortcoming to this laminated multi-layer assembly is the poor dimension stability that exists due to a mismatch of the coefficients of expansion between the ceramic layers and the thermal set adhesive sheets. To alleviate this problem in the past, a thermal-stress barrier commonly known as a buffer board, was used to absorb the thermal stress from the module. The buffer board was placed between the infrared detector arrays and the module and thus provides for electrical and mechanical interconnection therebetween.

A fused multi-layer module was disclosed by Hornback, U.S. Pat. No. 5,128,749 (also assigned to Grumman Corporation), the entire disclosure of which is hereby incorporated by reference. Hornback disclosed a glass binding material that adhesively attached adjacent substrate layers together. The glass binding material has a coefficient of expansion approximately equal to the coefficient of expansion of the substrate layers such that the thermal stress is reduced and the need for a buffer board is consequently eliminated. The glass binding material has a low temperature of melting point between 400°–500° C., and bonds adjacent substrate layers utilizing firing durations of less than twenty minutes.

Thin-films have been in general use for well over a hundred years. Among the earliest uses were decorative thin-films on glass and ceramics. From the early examples have evolved the diverse types of thin-films currently used. Included are thin-films used for protective and insulating purposes, as well as conductive thin-films used in microelectronics. Chemical vapor deposition is the most common technique for forming thin-film materials on substrate surfaces. Reactants are absorbed by the substrate and a chemical reaction and diffusion occur on the surface.

It is important that high temperatures either in the field or during manufacturing processing not degrade thin-film metallization once it is deposited. Patterns in the microcircuits may be damaged as a result of diffusion, migration, and oxidation, which may cause the thin-film materials to form hillocks or lose their adhesion to the substrate. Thin-film circuits are generally not used with high temperature applications nor processed at temperatures above 400° C. Instead, thick film materials are used but they cannot achieve the same fine line geometries as required in the thin-film microcircuits.

More specifically, in the Z-technology ceramic multi-chip modules, thin-film materials are sputter deposited onto thin-film grade alumina (99.6% $Al_2O_3$) substrates and delineated to form the required microchip patterns. Sputtering is a process in which material is removed from a source (the cathode) and accelerated through a plasma and deposited on the substrate (the anode). Then individual pattern layers are laminated together to form a multi-layer Z-module using a glass fusion-lamination technique, as described in Hornback, U.S. Pat. No. 5,128,749. The fusion-lamination process uses low temperature firable glass at temperatures as high as 600° C. with pressure up to 300 kN/m². Under these conditions, however, microcircuits made with sputtered thin-film materials have failed on the conventional substrates due to the factors described above.

In view of the shortcomings of the prior art it is desirable to provide thin-film microcircuits with fine lines and pitches, that are resistant to high temperature processing and operating conditions.

SUMMARY OF THE INVENTION

The present invention specifically addresses and alleviates the above deficiencies associated with the prior art. Generally, the present invention comprises a substrate of a high purity alumina ceramic that is densely packed with small grain size, and a sputtered thin-film metallization system deposited on the substrate to form a thin-film microcircuit that is resistent to temperatures above 400° C. More particularly, in the preferred embodiment of the invention, the metallization system includes an underlying layer of a refractory metal and a top layer of gold.

A process to manufacture the thin-film microcircuit of the present invention includes the steps of providing a substrate of a high purity alumina ceramic, densely packed and small grain size, and sputtering a thin-film metallization onto the substrate. The preferred embodiment includes applying a vacuum anneal to further strengthen the structure of the metallization and its adhesion to the substrate. Annealing is a heat treatment where material is exposed to an elevated temperature for an extended time period and then slowly cooled. Application of the vacuum anneal may also be used to strengthen the patterns on thin-film microcircuits made on the conventional alumina substrate, but the improvement is small.

The present invention allows fine line thin film microcircuit patterns to be processed at temperatures up to 600° C. for the first time, without degradation and migration of the refractory metal into the substrate. As evidence by the exceptional adhesion strength, TABLE 1 below reports the results of wire pull tests comparing the same thin-film system deposited on regular 99.6% alumina substrates and high-purity substrates. The wire-pull test is an indication of the metal to substrate adhesion strength.

TABLE 1

WIRE PULL TEST RESULTS

| CONDITION | HIGH PURITY ALUMINA (Present Invention) | CONVENTIONAL ALUMINA (Prior Art) |
| --- | --- | --- |
| AS-DEPOSITED | 60 g | 40 g |
| AFTER 550° C. BAKE | 60 g | 0 g * |
| ANNEALED, THEN 550° C. BAKE | 70 g | 20 g |

* Metallization adhesion failure due to migration of refractory metal into the substrate These, as well as other advantages of the present invention will become more apparent from the following detailed description. It is understood that changes in the specific structure shown and described may be made within the scope of the claims without departing from the spirit of the invention.

BRIEF DESCRIPTION OF THE DRAWINGS

FIG. 1a is a micrographic representation of a high purity, densely packed alumina ceramic formed in accordance with the present invention;

FIG. 1b is a micrographic representation of a conventional sintered alumina ceramic, thin film grade (99.6%);

DETAILED DESCRIPTION OF THE PREFERRED EMBODIMENT

Figure 2A:
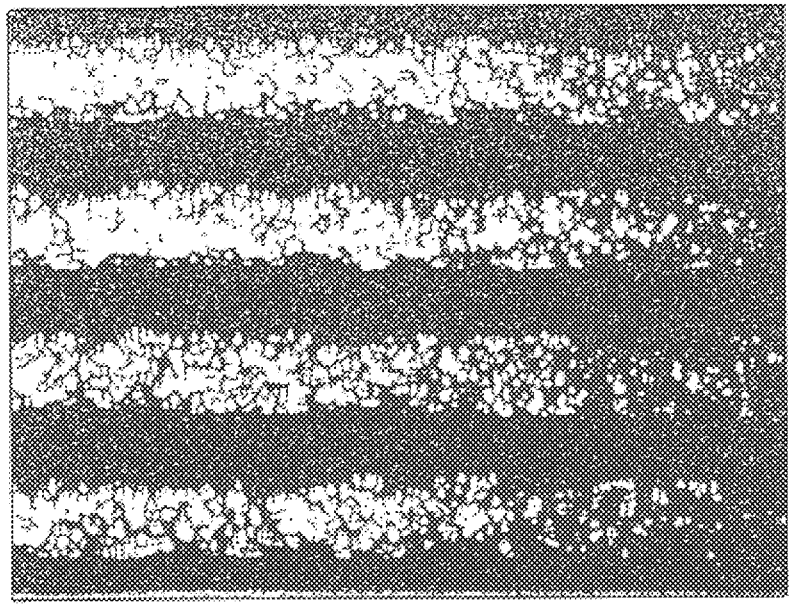
FIG. 2a is a micrographic representation of a gold thin film on a conventional substrate after being heated to 500° C.
Figure 2B:
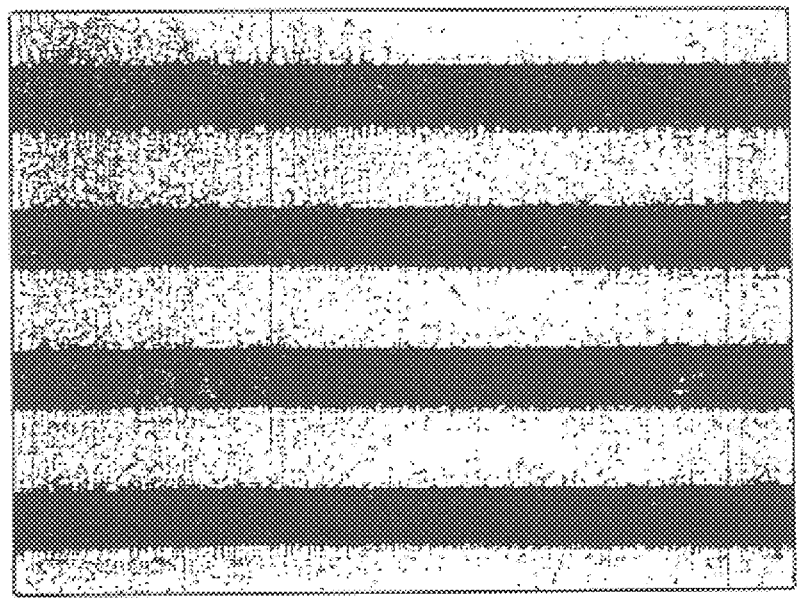
FIG. 2b is a micrographic representation of a thin film substrate formed in accordance with the present invention after being heated to 500° C.

The detailed discussion set forth below is intended as a description of the presently preferred embodiment of the invention, and is not intended to represent the only form in which the present invention may be constructed or utilized. The description sets forth the functions and sequence of steps for constructing and operating the invention. It is to be understood, however, that the same or equivalent functions and sequences may be accomplished by different embodiments that are intended to be encompassed within the spirit and scope of the invention.

The substrates of the present invention is a high purity (99.9%) aluminum oxide, $Al_2O_3$, with a very densely packed grain structure greater than 3.90 grams per cubic centimeter and an average grain size of less than 1 micron, resulting in an as fired surface finish of approximately 0.03 microns. Conventional commercial thin-film grade 99.6% alumina have an as sintered density of 3.86–3.90 grams per cubic centimeter and an average grain size of 2 $\mu$m, resulting in a surface finish of 0.08 microns. See Table 2 below for a comparison between the substrate of the present invention and the prior art.

TABLE 2

SUBSTRATE MATERIAL PROPERTIES

| PROPERTY | UNITS | HIGH-PURITY ALUMINA (Present Invention) | CONVENTIONAL ALUMINA (Prior Art) |
| --- | --- | --- | --- |
| $Al_2O_3$ CONTENT | % | 99.9 | 99.6 |
| DENSITY | g/cm³ | 3.97 | 3.86–3.90 |
| AVG. GRAIN SIZE | $\mu$m | <1 | <2 |
| GRAIN PACKING | | VERY DENSE | AS SINTERED |
| SURFACE FINISH | $\mu$ | 0.03 | 0.08 |

Suitable high purity alumina ceramic material is "NALTUS" alumina ceramic material marketed by Asahi Chemical Industry Company of Japan.

Surface cleanliness is very important in adhesion of the thin-film metallization to the substrate. Prior to the sputter deposition, the substrates are cleaned in a 10% hydrochloric acid and then scrubbed and rinsed. When placed inside the sputtering chamber before sputter deposition, a 3 minute radio frequency etching process is applied.

The thin-films consist of a sputter deposited underlying refractory metal, preferably a titanium (Ti)-tungsten (W)

mixed composition, followed by preferably a gold layer. The refractory metal alternatively may be titanium, tungsten, titanium nitride or molybdenum. The breakdown of the preferred refractory metallization source material is a high purity (99.9%) 10–90 weight percent Ti-W, although other compositions such as 20–80 weight percent are also acceptable. The deposited composition of the Ti-W on the anode may differ from that of the cathode source by 3–5 weight percent. Sputter deposition of the direct current-magnetron technique is performed, with power of 4500 volts and an argon backfilled vacuum of $3\times10^{-5}$ mbar. Gold is subsequently deposited atop the Ti-W layer. Typical deposited thicknesses are 1500–3000 Angstroms for the underlying metals and up to 2 microns for the gold. The magnetron technique uses a closed magnetic field loop to confine and compress the plasma causing the ionized gas to sputter efficiently.

The Ti-W/Au metallization, as deposited on the high purity (99.9%) aluminum oxide ($Al_2O_3$) substrate, has improved strength for being heated and processed at temperatures up to 550° C. An additional vacuum annealing procedure may be applied to further increase the mechanical strength and durability of this metallization. In this procedure, the as-deposited metallized substrates are placed in a vacuum oven and heated to between 500°–600° C. for 20–30 minutes under 0.05 Torr vacuum. The vacuum annealed metallization shows improved strength and may be processed at temperature up to 600° C. without deforming its patterns or losing adhesion. The vacuum annealing procedure may also be done with a trace of nitrogen, such as 5% nitrogen in the 0.05 Torr vacuum.

Figure 3:
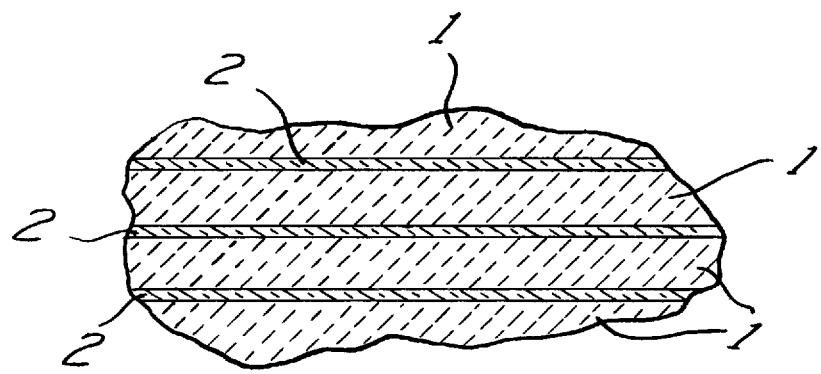
FIG. 3 is a fragmentary side view showing a glass binding material layer disposed intermediate plural substrate layers such that the substrate layers are disposed in overlapping registry, to fuse the substrate layers together to form an infrared high-density multi-layer integrated circuit module.

As shown in FIG. 3, a fused multi-layer module having thin-film microcircuits is thus formed by disposing a glass binding material layer 2 intermediate substrate layers 1 such that the substrate layers 1 are disposed in substantially overlapping registry. The glass binding material layers 2 fuse the substrate layers 1 together to form an infrared high-density multi-layer integrated circuit module.

It is understood that the high temperature resistant thin-film system described, as applied to integrating infrared detector arrays to signal conditioning electronics, represents only a preferred embodiment of the invention. Indeed, various modifications and additions may be made to the preferred embodiment, without departing from the spirit and scope of the invention. These modifications and additions may be obvious to those skilled in the art and may be implemented to adapt the present invention for use in a variety of different applications.

What is claimed is:

1. A process to manufacture a thin-film microcircuit, comprising:

providing a substrate made of at least 99.9% aluminum oxide with a density greater than 3.90 grams per cubic centimeter and an average grain size of less than 1 micron;

sputtering a thin-film metallization onto the substrate, said metallization sequentially consisting of a sputter-deposited underlying refractory metal layer followed by a sputter-deposited gold layer atop the refractory metal layer; and applying a vacuum anneal to the metallization.

2. The process of claim 1, wherein applying a vacuum anneal comprises heating the metallization to 400°–600° C. for 20–30 minutes under 0.05 Torr air.

3. The process of claim 1, wherein the vacuum anneal is applied under nitrogen.

4. The process of claim 1 wherein the underlying refractory metal layer is fabricated of metal chosen from the group consisting of a titanium-tungsten mixed composition, titanium, tungsten, and molybdenum.

* * * * *